(12) United States Patent
Choi et al.

(10) Patent No.: US 11,493,849 B2
(45) Date of Patent: Nov. 8, 2022

(54) ANTI-REFLECTIVE HARDMASK COMPOSITION

(71) Applicant: OLAS CO., LTD., Cheonan-si (KR)

(72) Inventors: Sang Jun Choi, Seoul (KR); Wanuk Kim, Cheongju-si (KR)

(73) Assignee: OLAS CO., LTD., Cheonan-si (KR)

( * ) Notice: Subject to any disclaimer, the term of this patent is extended or adjusted under 35 U.S.C. 154(b) by 475 days.

(21) Appl. No.: 16/745,481

(22) Filed: Jan. 17, 2020

(65) Prior Publication Data
US 2020/0233305 A1 Jul. 23, 2020

(30) Foreign Application Priority Data

Jan. 18, 2019 (KR) .................. 10-2019-0006959

(51) Int. Cl.
*G03F 7/11* (2006.01)
*C08G 14/06* (2006.01)
*C09D 5/00* (2006.01)
*C09D 161/34* (2006.01)

(52) U.S. Cl.
CPC ............... *G03F 7/11* (2013.01); *C08G 14/06* (2013.01); *C09D 5/006* (2013.01); *C09D 161/34* (2013.01)

(58) Field of Classification Search
CPC . G03F 7/11; G03F 7/091; G03F 7/094; C09D 161/34; C08G 14/06
See application file for complete search history.

(56) References Cited

U.S. PATENT DOCUMENTS

2016/0090449 A1* 3/2016 Nam ................... H01L 21/3081
524/317
2019/0067021 A1* 2/2019 Kori ......................... C08G 8/08

FOREIGN PATENT DOCUMENTS

| KR | 10-2008-0107210 | 12/2008 |
| KR | 1020090068444 | 6/2009 |
| KR | 10-2009-0120827 | 11/2009 |
| KR | 10-2012-0038447 | 4/2012 |
| KR | 101770749 | 8/2017 |
| KR | 1020170126750 | 11/2017 |
| KR | 1020180087331 | 8/2018 |
| WO | 2013100365 | 7/2013 |

* cited by examiner

*Primary Examiner* — Amanda C. Walke
(74) *Attorney, Agent, or Firm* — Lex IP Meister, PLLC

(57) ABSTRACT

Provided is an anti-reflective hardmask composition including: (a) a polymer composed of an indolocarbazole represented by the following Chemical Formula 1 or a polymeric blend containing the same; and (b) an organic solvent.

[Chemical Formula 1]

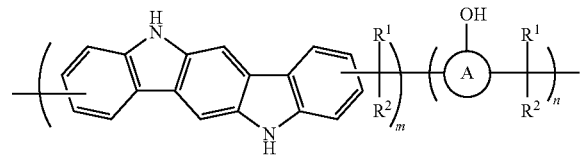

11 Claims, No Drawings

ANTI-REFLECTIVE HARDMASK COMPOSITION

CROSS-REFERENCE TO RELATED APPLICATION

This application claims priority to and the benefit of Korean Patent Application No. 10-2019-0006959 filed in the Korean Intellectual Property Office on Jan. 18, 2019, the entire contents of which are incorporated herein by reference.

BACKGROUND OF THE INVENTION

(a) Field of the Invention

The present invention relates to a hardmask composition having anti-reflective film characteristics useful for a lithographic process, and more particularly to a polymer containing an indolocarbazole-based aromatic ring having strong absorption in an ultraviolet ray wavelength region, and a hardmask composition containing the same.

(b) Description of the Related Art

Recently, while the semiconductor industry has been increasingly demanding a miniaturization process, an effective lithographic process is indispensable for realizing such ultra-fine technology. In particular, the demand for new materials for the hardmask process, which has become extremely indispensable in the etching process, is increasing.

In general, the hardmask layer serves as an intermediate film that transfers a fine pattern of a photoresist to a lower substrate layer through a selective etching process. Accordingly, the hardmask layer is required to have properties such as chemical resistance, heat resistance, and etching resistance so as to withstand multiple etching processes. As a hardmask layer used in the related art, an amorphous carbon layer (ACL) made by a chemical vapor deposition (CVD) method has been used, and as drawbacks about the quality of the ACL, there are many inconveniences in which the ACL is used due to facility investments requiring high unit costs and photolithographic alignment problems caused by particles and layer opacity generated during the process.

Recently, a spin-on hardmask, which is formed by a spin-on coating method, has been introduced instead of the chemical vapor deposition method. The spin-on coating method uses an organic polymer material that is soluble in a solvent to form a hardmask composition, but in this case, the most important characteristic needs to form an organic polymer coating film that simultaneously has etching resistance.

However, two characteristics required for such an organic hardmask layer, that is, the characteristics for solubility and etching resistance, required a hard mask composition that can satisfy all of the characteristics in a mutually contradictory relationship. Materials, which are introduced into semiconductor lithographic processes while satisfying the characteristics of the organic hardmask material, have been recently introduced (Korean Patent Application Laid-Open No. 10-2009-0120827, Korean Patent Application Laid-Open No. 10-2008-0107210, and International Patent WO 2013100365 A1, and these materials are hardmask materials using a copolymer having an appropriate molecular weight, which is synthesized by an existing phenol resin preparation method using a hydroxypyrene.

However, even though the semiconductor lithographic process has been increasingly subjected to a miniaturization process in recent years, the organic hardmask material has reached a step where it is difficult to sufficiently serve as a mask due to a shortage of etching selectivity in the etching process compared to the existing inorganic hardmask material. Therefore, there is an urgent need for the introduction of an organic hardmask material that is more optimal for the etching process.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a hardmask polymer having excellent polymer solubility and simultaneously having high etching selectivity and sufficient resistance to multiple etching, and a composition containing the same.

The present invention has also been made in an effort to provide a novel hardmask polymer which may minimize the reflectivity between a resist and a backing layer, and thus may be used for performing a lithographic technology, and a composition containing the same.

The hardmask composition according to exemplary embodiments of the present invention is an anti-reflective hardmask composition including: (a) a polymer composed of an indolocarbazole represented by the following Chemical Formula 1 or a polymeric blend containing the same; and
(b) an organic solvent.

[Chemical Formula 1]

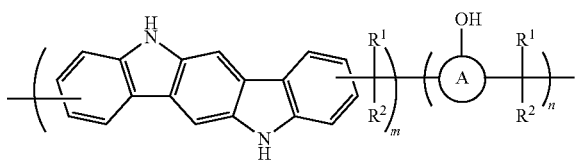

The hardmask composition based on the indolocarbazole-based polymer according to the embodiments of the present invention has a very high polymerization rate as compared to the existing phenol-based polymer.

The hardmask composition based on the indolocabazole polymer according to the embodiments of the present invention has a very high packing density, and thus has characteristics in which when a thin film is formed, etching resistance is excellent while the film density is increased. Accordingly, it is possible to provide a lithographic structure which has sufficient resistance to multiple etching due to a higher etching selectivity ratio than that of an existing organic hardmask, and thus has an excellent pattern evaluation result.

The hardmask composition based on the indolocarbazole-based polymer according to exemplary embodiments of the present invention can minimize the reflectivity between a resist and a backing layer by having a refractive index and an absorptivity within useful ranges as an anti-reflective film in a deep UV region such as ArF (193 nm) and KrF (248 nm) when a film is formed.

DETAILED DESCRIPTION OF THE EMBODIMENTS

By the present invention, provided is an anti-reflective hardmask composition including: (a) a polymer composed of an indolocarbazole represented by the following Chemical Formula 1 or a polymeric blend containing the same; and (b) an organic solvent.

[Chemical Formula 1]

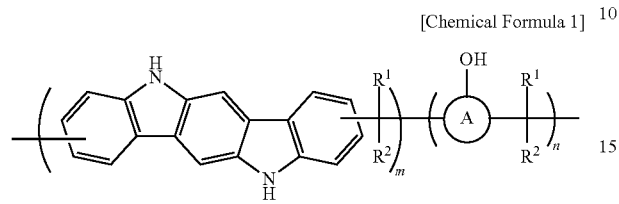

In the formula, $R^1$ and $R^2$ groups are each one selected from the group consisting of hydrogen (H), a C1-C10 alkyl group, and a C6-C20 aryl group, and $R^1$ and $R^2$ may be the same as or different from each other.

$R^1$ and $R^2$ may be a substituent derived from a compound having an aldehyde, acetal, ketal, dimethoxy, or diethoxy functional group. Preferably, $R^1$ and $R^2$ are each composed of hydrogen, or an aromatic compound as follows.

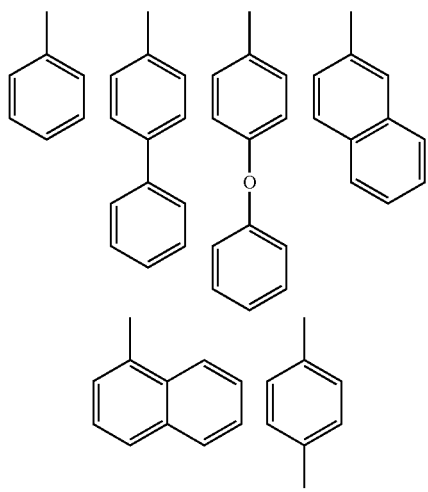

It may be preferred in terms of polymer solubility that at least one of $R^1$ and $R^2$ is hydrogen, and the other uses any one of

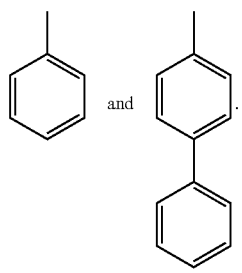

Meanwhile, A may be composed of an aromatic compound having a $C_6$-$C_{40}$ hydroxyl group (OH). Preferably, A is composed of any one compound selected from the compounds having the following structures.

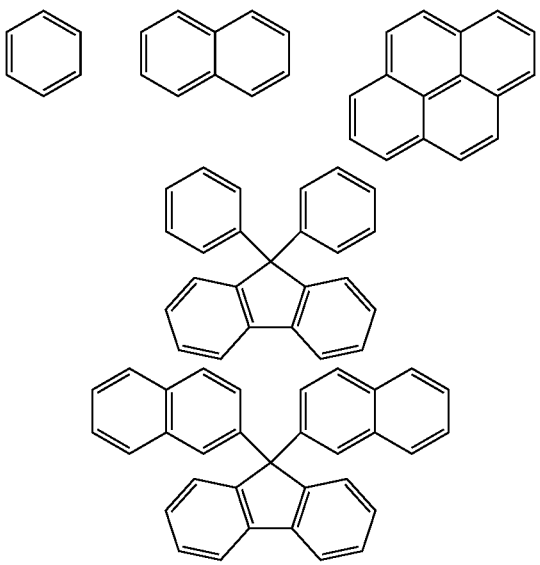

When any one of

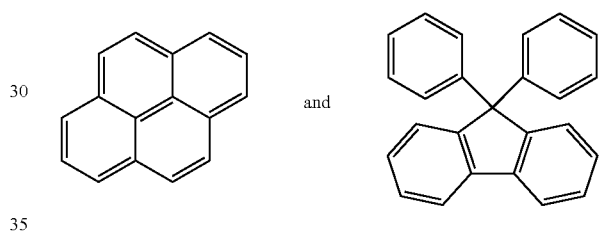

is used as A, A may be preferred in terms of polymer solubility.

Here, m/(m+n) has a range of 0.05 to 0.9 range, and the entire copolymer has a weight average molecular weight (Mw) of 1,000 to 30,000, and may have preferably a range of 2,000 to 5,000.

Meanwhile, in order to make a hardmask composition, the polymer composed of the above (a) indolocarbazole is preferably used in an amount of 1 to 30% by weight based on 100 parts by weight of the (b) organic solvent used. When the polymer prepared by indolocarbazole is used in an amount of less than 1 part by weight or more than 30 parts by weight, the thickness becomes less than or more than a desired coating thickness, so that it is difficult to adjust an exact coating thickness.

Moreover, the organic solvent is not particularly limited as long as the organic solvent is sufficiently soluble in the above aromatic ring-containing polymer, and examples thereof include propylene glycol monomethyl ether acetate (PGMEA), cyclohexanone, ethyl lactate, and the like.

Further, the anti-reflective hardmask composition of the present invention may additionally include (c) a crosslinker component and (d) an acid catalyst.

The (c) crosslinking component used in the hardmask composition of the present invention is preferably capable of crosslinking the repeating unit of the polymer by heating in the reaction catalyzed by the generated acid, and the d) acid catalyst is preferably a heat-activated acid catalyst.

The (c) crosslinking component used in the hardmask composition of the present invention is not particularly limited as long as the (c) crosslinking component is capable of reacting with the hydroxyl group of the aromatic ring-containing polymer in a manner that may be catalyzed by the generated acid. Specific examples thereof include etherified amino resins, for example, methylated or butylated melamine resins (specific examples thereof include N-methoxymethy-melamine resin or N-butoxymethyl-melamine resin) and methylated or butylated urea resins (specific examples thereof include Cymel U-65 Resin or UFR 80 Resin), gylcoluril compounds (specific examples thereof include Powderlink 1174), bisepoxy compounds (specific examples thereof include 2,6-bis(hydroxymethyl)-p-cresol compound), or the like.

As the (d) acid catalyst used in the hardmask composition of the present invention, an organic acid such as p-toluenesulfonic acid monohydrate, and a thermal acid generator (TAG)-based compound intended to ensure the storage stability may also be used as the catalyst. The TAG is an acid generator compound designed to release acids during heat treatment, and it is preferred that for example, pyridinium P-toluene sulfonate, 2,4,4,6-tetrabromo cyclohexadieneone, benzoin tosylate, 2-nitrobenzyl tosylate, alkyl esters of organic sulfonic acid, and the like are used.

When a final hardmask composition further include (c) a crosslinker component and (d) an acid catalyst, the hardmask composition of the present invention may be included in an amount of total 100 wt % by using 1 to 30 wt %, more preferably 3 to 15 wt % of (a) a polymer prepared from an indolocarbazole having strong absorption characteristics in an ultraviolet ray region or a polymer blend containing the same, 0.1 to 5 wt %, more preferably 0.1 to 3 wt % of (c) a crosslinker component, 0.001 to 0.05 wt %, more preferably 0.001 to 0.03 wt % of (d) an acid catalyst, and (b) an organic solvent as the other component, and it is preferred to contain preferably 75 to 98 wt % of the organic solvent.

Here, when the aromatic ring-containing polymer is included in an amount less than 1 wt % or more than 30 wt %, the thickness becomes less than or more than a desired coating thickness, so that it is difficult to adjust an exact coating thickness.

Furthermore, when the crosslinker component is included in an amount less than 0.1 wt %, crosslinking characteristics may not be exhibited, and when the crosslinker component is included in an amount more than 5 wt %, the optical characteristics of the coating film may be changed by introducing an excessive amount of the crosslinker component.

Further, when the acid catalyst is included in an amount less than 0.001 wt %, the crosslinking characteristics may not be exhibited well, and when the acid catalyst is included in an amount more than 0.05 wt %, the storage stability may also be affected by an increase in acidity due to introduction of the excessive amount of the acid catalyst.

Hereinafter, the present invention will be described in more detail through exemplary embodiment, but the following exemplary embodiments are provided for illustrative purposes only and are not intended to limit the scope of the rights of the present invention.

Preparation Example 1

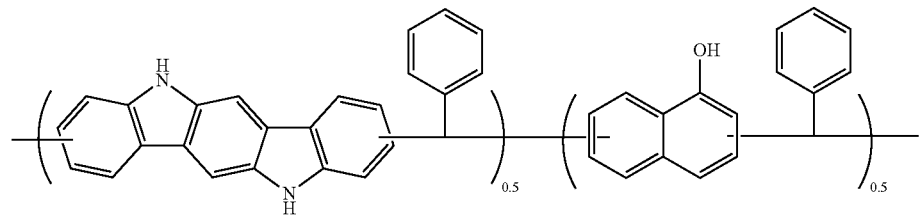

In a 250 mL round flask, 13 g (50 mmol) of indolocarbazole (5,11-dihydroindolo [3,2-b]carbazole), 12.7 g (120 mmol) of benzaldehyde, and 7.2 g (50 mmol) of 1-naphthol were completely dissolved in 98 g of γ-butyrolactone (GBL) at a temperature of 60° C., and then 1 g of a sulfuric acid stock solution was added thereto.

The resulting mixture was polymerized for about 12 hours while maintaining the reaction temperature at about 120° C., and then the reactant was added dropwise to an excessive amount of co-solvent of methanol/water at 7:3, and then the resulting mixture was neutralized using triethylamine (TEA). The produced precipitate was dissolved again in a suitable amount of the GBL solvent, and then precipitated using an excessive amount of a co-solvent of ethanol/water at 8:2.

The produced precipitate was filtered and dried in a vacuum oven at 50° C. for about 20 hours, and then a polymer having a weight average molecular weight (Mw) of 2,400 could be obtained.

Preparation Example 2

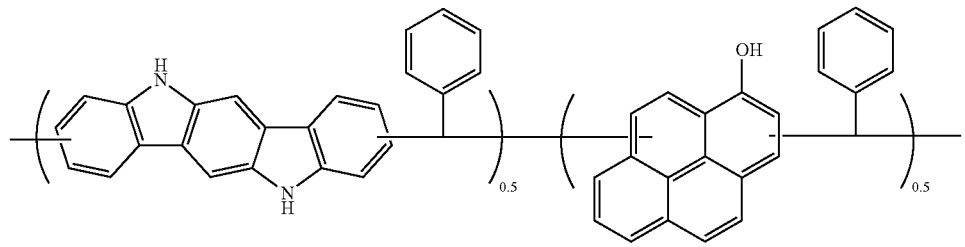

A polymer was synthesized in the same manner as in Preparation Example 1 using 13 g (50 mmol) of indolocarbazole, 12.7 g (120 mmol) of benzaldehyde, and 11 g (50 mmol) of 1-pyrenol.

After the polymer was purified, a polymer having a weight average molecular weight (Mw) of 2,500 could be obtained.

Preparation Example 3

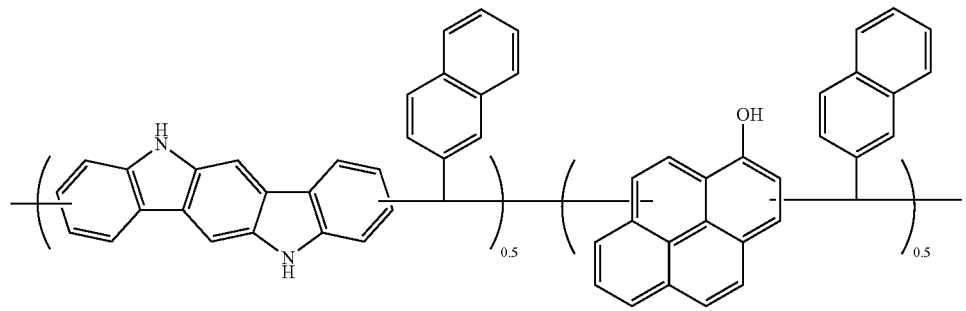

A polymer was synthesized in the same manner as in Preparation Example 1 using 13 g (50 mmol) of indolocarbazole, 18.7 g (120 mmol) of 2-naphthaldehyde, and 11 g (50 mmol) of 1-pyrenol.

After the polymer was purified, a polymer having a weight average molecular weight (Mw) of 2,300 could be obtained.

Preparation Example 4

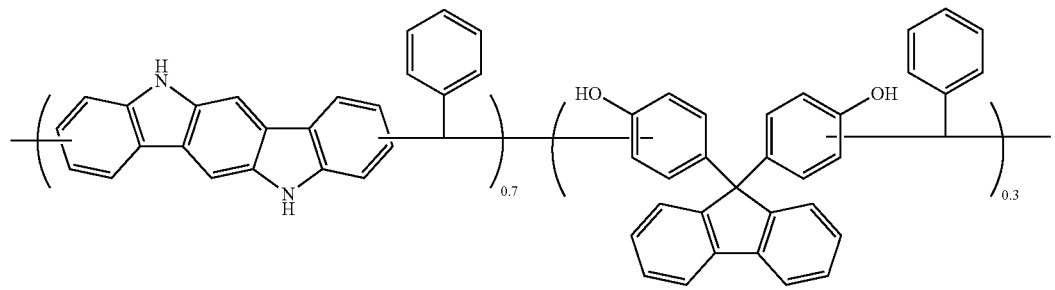

A polymer was synthesized in the same manner as in Preparation Example 1 using 18 g (70 mmol) of indolocarbazole, 12.7 g (120 mmol) of benzaldehyde, and 10.5 g (30 mmol) 9,9-bis(4-hydroxyphenyl)fluorene.

After the polymer was purified, a polymer having a weight average molecular weight (Mw) of 2,600 could be obtained.

Preparation Example 5

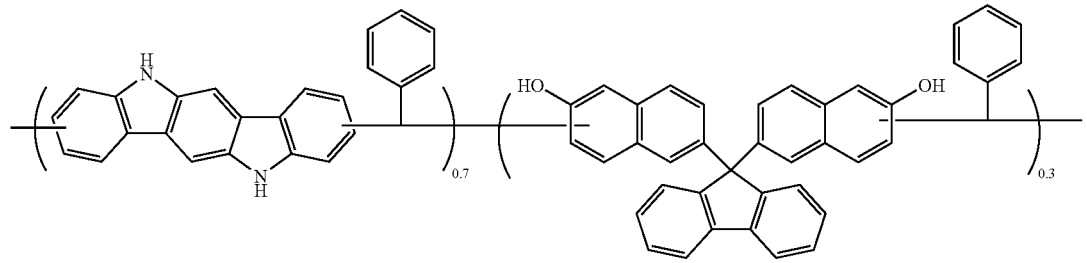

A polymer was synthesized in the same manner as in Preparation Example 1 using 18 g (70 mmol) of indolocarbazole, 12.7 g (120 mmol) of benzaldehyde, and 13.5 g (30 mmol) of 9,9-bis(4-hydroxynaphtyl)fluorene.

After the polymer was purified, a polymer having a weight average molecular weight (Mw) of 2,400 could be obtained.

Preparation Example 6

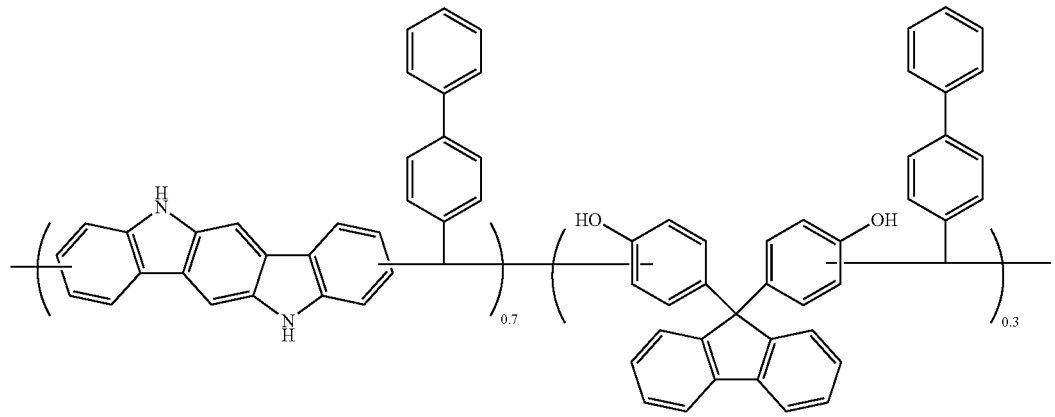

A polymer was synthesized in the same manner as in Preparation Example 1 using 18 g (70 mmol) of indolocarbazole, 21.8 g (120 mmol) of biphenylaldehyde, and 10.5 g (30 mmol) of 9,9-bis(hydroxyphenyl)fluorene.

After the polymer was purified, a polymer having a weight average molecular weight (Mw) of 2,500 could be obtained.

Preparation Example 7

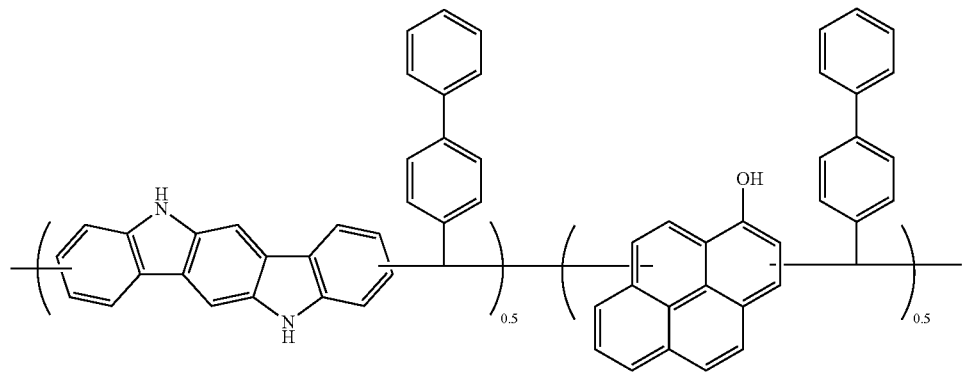

A polymer was synthesized in the same manner as in Preparation Example 1 using 13 g (50 mmol) of indolocarbazole, 25 g (110 mmol) of biphenylaldehyde dimethyl acetal, and 11 g (50 mmol) of 1-pyrenol.

After the polymer was purified, a polymer having a weight average molecular weight (Mw) of 2,600 could be obtained.

Preparation Example 8

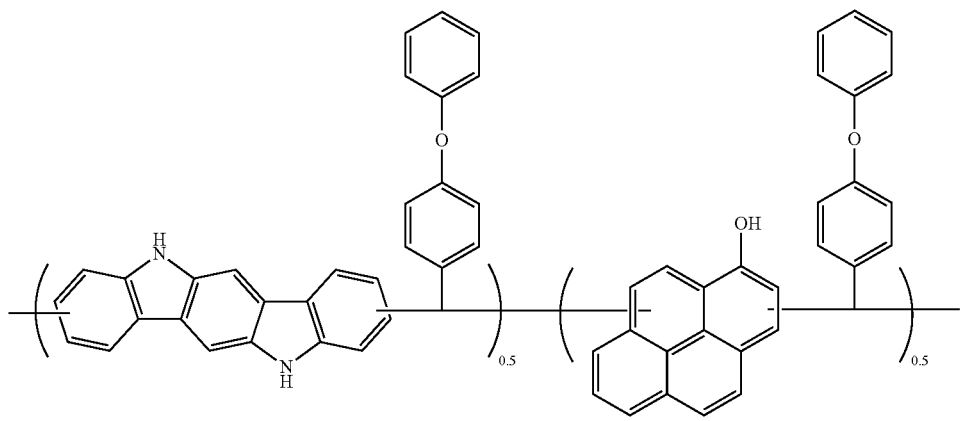

A polymer was synthesized in the same manner as in Preparation Example 1 using 13 g (50 mmol) of indolocarbazole, 24 g (120 mmol) of 4-phenoxybenzaldehyde, and 11 g (50 mmol) of 1-pyrenol.

After the polymer was purified, a polymer having a weight average molecular weight (Mw) of 2,500 could be obtained.

Preparation Example 9

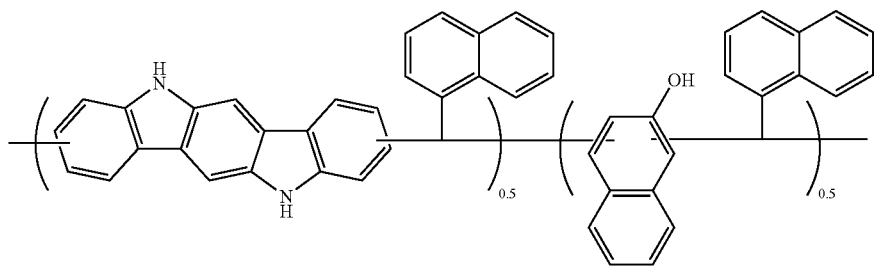

A polymer was synthesized in the same manner as in Preparation Example 1 using 13 g (50 mmol) of indolocarbazole, 18.7 g (120 mmol) of 1-naphthaldehyde, and 7.2 g (50 mmol) of 2-naphthol.

After the polymer was purified, a polymer having a weight average molecular weight (Mw) of 2,400 could be obtained.

Comparative Example) Synthesis of Phenol-Based Polymer

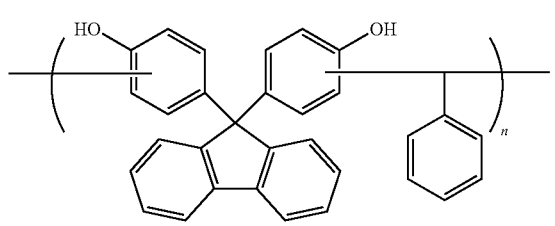

35 g (100 mmol) of 9,9-bis(hydroxyphenyl)fluorene and 12.7 g (120 mmol) of benzaldehyde were dissolved in 115 g of PGMEA, and then 1 g of concentrated sulfuric acid was added thereto.

The resulting mixture was polymerized in the same manner as in Preparation Example 1, and then the polymer was purified and dried in a vacuum oven, and then a polymer having a weight average molecular weight of 3,300 could be obtained.

Preparation Examples 1 to 9 and Comparative Preparation Example

Preparation of Hardmask Composition 0.9 g of each of the polymers made in Preparation Examples 1 to 9 and Comparative Preparation Example was weighed, and the sample solutions in Preparation Examples 1 to 9 and the Comparative Preparation Example were made by putting and dissolving 0.9 g of each of the weighed polymers, 0.1 g of a glycoluril compound crosslinker (Powderlink 1174), and 1 mg of pyridinium P-toluene sulfonate in 9 g of propylene glycol monomethyl ether acetate (PGMEA) 9 g, and then filtering the resulting solution.

A silicon wafer was spin-coated with the sample solutions prepared in Preparation Example 1-9 and the Comparative Preparation Example, respectively, and baked at 240° C. for 60 seconds, thereby forming a film having a thickness of 3000 Å. In this case, the refractive index n and extinction coefficient k of the formed films were each obtained. The device used was an Ellipsometer (J. A. Woollam), and the measurement results are shown in Table 1.

As a result of evaluation, it was confirmed that the films had a refractive index and an absorbance as an anti-reflective film at ArF (193 nm) and KrF (248 nm) wavelengths. Typically, the refractive index range of a material used as a semiconductor anti-reflective film is approximately 1.4 to 1.8, the extinction coefficient is important, and when the k value is typically 0.3 or more, there is no problem in using the film as an anti-reflective film, so that it can be seen that the hardmask composition according to exemplary embodiments of the present invention may be used as an anti-reflective film.

TABLE 1

| Type of sample | Optical characteristics (193 nm) | | Optical characteristics (248 nm) | |
| --- | --- | --- | --- | --- |
|  | Refractive index (n) | Extinction coefficient (k) | Refractive index (n) | Extinction coefficient (k) |
| Preparation Example 1 | 1.51 | 0.68 | 1.70 | 0.53 |
| Preparation Example 2 | 1.50 | 0.70 | 1.71 | 0.53 |
| Preparation Example 3 | 1.49 | 0.71 | 1.70 | 0.52 |
| Preparation Example 4 | 1.52 | 0.69 | 1.73 | 0.53 |
| Preparation Example 5 | 1.54 | 0.70 | 1.72 | 0.54 |
| Preparation Example 6 | 1.53 | 0.71 | 1.72 | 0.54 |
| Preparation Example 7 | 1.52 | 0.69 | 1.73 | 0.55 |
| Preparation Example 8 | 1.52 | 0.70 | 1.73 | 0.53 |
| Preparation Example 9 | 1.53 | 0.68 | 1.71 | 0.53 |
| Comparative Preparation Example | 1.48 | 0.68 | 1.95 | 0.35 |

Lithographic Evaluation of Anti-Reflective Hardmask Composition

A silicon wafer coated with aluminum was spin-coated with the sample solutions prepared in Preparation Examples 2, 3, 4, and 6 and the Comparative Preparation Example, respectively, and baked at 240° C. for 60 seconds, thereby forming a film having a thickness of 3000 Å.

Each of the formed coating films was coated with KrF photoresist, baked at 110° C. for 60 seconds, exposed using an exposure instrument (ASML XT:1400, NA 0.93), and then developed for 60 seconds using teteramethyl ammonium hydroxide (TMAH, 2.38 wt % aq. Solution). And then, as a result of observing a 90 nm line and space pattern using V-SEM, respectively, the results shown in the following Table 2 were obtained. An expose latitude (EL) margin due to the change in exposure amount and a depth of focus (DoF) margin due to the variation in distance to a light source were observed, and recorded in Table 2. As a result of the pattern evaluation, good results could be confirmed in terms of profile and margin, and it could be seen that the results satisfied the EL margin and the DoF margin required for an evaluation of the lithographic pattern.

TABLE 2

| Type of sample | Pattern characteristics | | |
| --- | --- | --- | --- |
|  | EL margin (ΔmJ/energy mJ) | DoF margin (μm) | Pattern shape |
| Preparation Example 2 | 0.4 | 0.4 | cubic |
| Preparation Example 3 | 0.3 | 0.3 | cubic |
| Preparation Example 4 | 0.4 | 0.3 | cubic |
| Preparation Example 6 | 0.4 | 0.4 | cubic |
| Comparative Preparation Example | 0.2 | 0.2 | undercut |

Etching Characteristic Evaluation of Anti-Reflective Hardmask Composition

Specimens patterned in Preparation Examples 2, 3, and 6 and Comparative Preparation Example were dry-etched on a SiON bottom anti-reflective coating (BARC) using PR as a mask with $CHF_3/CF_4$ mixed gas, and then the present hardmask was dry-etched again using the SiON anti-reflective film as a mask with $O_2/N_2$ mixed gas. Thereafter, the silicon nitride (SiN) layer was dry-etched using the hardmask as a mask with $CHF_3/CF_4$ mixed gas, and then $O_2$ ashing and wet strip process were performed on the remaining hardmask and organic materials.

Immediately after the hardmask etching and the silicon nitride etching, the cross-section of each specimen was observed using V-SEM, and the result is shown in Table 3. As a result of etching evaluation, after the hardmask etching and after the silicon nitride etching, each of the pattern shapes was all good without any bowing phenomenon and the resistance due to the etching process was sufficient, so that it was confirmed that the etching process was performed well on the silicon nitride layer.

TABLE 3

| Sample | Pattern shape (after hardmask etching) | Pattern shape (after SiN etching) |
| --- | --- | --- |
| Preparation Example 2 | Vertical shape | Vertical shape |
| Preparation Example 3 | Vertical shape | Vertical shape |
| Preparation Example 6 | Vertical shape | Vertical shape |
| Comparative Preparation Example | Slightly bowing shape | Bowing shape |

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. An anti-reflective hardmask composition comprising:
   (a) a polymer composed of an indolocarbazole represented by the following Chemical Formula 1 or a polymer blend comprising the same; and (b) an organic solvent:

[Chemical Formula 1]

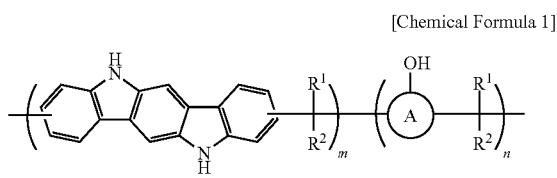

in the formula, $R^1$ and $R^2$ are each independently any one selected from the group consisting of hydrogen (H), a $C_1$-$C_{10}$ alkyl group, and a $C_6$-$C_{20}$ aryl group, and $R_1$ and $R_2$ are optionally the same as or different from each other, A is an aromatic compound having a $C_6$-$C_{40}$ hydroxyl group (OH), m/(m+n)=0.05 to 0.9, and a weight average molecular weight (Mw) is 1,000 to 30,000.

2. The anti-reflective hardmask composition of claim 1, wherein:
one of $R^1$ and $R^2$ is hydrogen, and the other is any one selected from the following substituents:

3. The anti-reflective hardmask composition of claim 1, wherein:
A is any one selected from the compounds having the following structures:

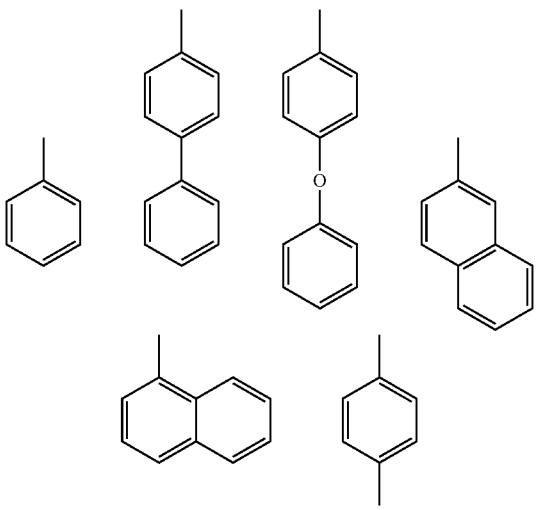

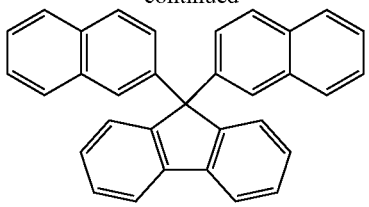

4. The anti-reflective hardmask composition of claim 1, wherein:
the hardmask composition further comprises a crosslinker and an acid catalyst component.

5. The anti-reflective hardmask composition of claim 4, wherein:
the hardmask composition is comprised in an amount of total 100 wt % by using
(a) 1 to 30 wt % of the polymer composed of the indolocarbazole or a polymer blend comprising the same;
(b) 0.1 to 5 wt % of a crosslinker component;
(c) 0.001 to 0.05 wt % of an acid catalyst; and
(d) an organic solvent as the other component.

6. The anti-reflective hardmask composition of claim 5, wherein:
the crosslinker is any one selected from the group consisting of a melamine resin, an amino resin, a glycoluril compound, and a bisepoxy compound.

7. The anti-reflective hardmask composition of claim 5, wherein:
the acid catalyst is selected from the group consisting of p-toluenesulfonic acid monohydrate, pyridinium p-toluene sulfonate, 2,4,4,6-tetrabromo cyclohexadieneone, benzoin tosylate, 2-nitrobenzyl tosylate, and alkyl esters of organic sulfonic acid.

8. The anti-reflective hardmask composition of claim 2, wherein:
the hardmask composition further comprises a crosslinker and an acid catalyst component.

9. The anti-reflective hardmask composition of claim 8, wherein:
the hardmask composition is comprised in an amount of total 100 wt % by using
(a) 1 to 30 wt % of the polymer composed of the indolocarbazole or a polymer blend comprising the same;
(b) 0.1 to 5 wt % of a crosslinker component;
(c) 0.001 to 0.05 wt % of an acid catalyst; and
(d) an organic solvent as the other component.

10. The anti-reflective hardmask composition of claim 9, wherein:
the crosslinker is any one selected from the group consisting of a melamine resin, an amino resin, a glycoluril compound, and a bisepoxy compound.

11. The anti-reflective hardmask composition of claim 9, wherein:
the acid catalyst is selected from the group consisting of p-toluenesulfonic acid monohydrate, pyridinium p-toluene sulfonate, 2,4,4,6-tetrabromo cyclohexadieneone, benzoin tosylate, 2-nitrobenzyl tosylate, and alkyl esters of organic sulfonic acid.

* * * * *